United States Patent
Lin et al.

(10) Patent No.: US 6,900,068 B2
(45) Date of Patent: May 31, 2005

(54) LIGHT EMITTING DIODE AND METHOD OF MAKING THE SAME

(75) Inventors: Jin-Ywan Lin, Chung Li (TW); Huan-Pin Huang, Hsinchu Hsien (TW); Chung-Cheng Tu, Taipei (TW)

(73) Assignee: United Epitaxy Co., Ltd., Hsinchu (TW)

( * ) Notice: Subject to any disclaimer, the term of this patent is extended or adjusted under 35 U.S.C. 154(b) by 0 days.

(21) Appl. No.: 10/921,926

(22) Filed: Aug. 20, 2004

(65) Prior Publication Data

US 2005/0017254 A1 Jan. 27, 2005

Related U.S. Application Data (62) Division of application No. 10/436,332, filed on May 13, 2003, now Pat. No. 6,838,704.

(30) Foreign Application Priority Data

Dec. 31, 2002 (TW) .......................... 91138081 A (51) Int. Cl.$^7$ ............................................... H01L 21/00
(52) U.S. Cl. ............................. 438/29; 438/46; 438/47; 438/39; 438/42
(58) Field of Search ............................. 438/29, 39, 42, 438/46; 257/79, 94, 98, 99; 372/44, 46

(56) References Cited

U.S. PATENT DOCUMENTS

| | | | |
|---|---|---|---|
| 6,222,207 B1 * | 4/2001 | Carter-Coman et al. | 257/98 |
| 6,462,358 B1 * | 10/2002 | Lin et al. | 257/99 |
| 6,583,443 B1 * | 6/2003 | Chang et al. | 257/79 |
| 2003/0143772 A1 * | 7/2003 | Chen | 438/47 |

* cited by examiner

*Primary Examiner*—Tom Thomas
*Assistant Examiner*—Matthew C Landau
(74) *Attorney, Agent, or Firm*—Troxell Law Office, PLLC

(57) ABSTRACT

A high reflective and conductive metal substrate instead of a GaAs substrate which is a light absorption substrate is utilized for the light emitting diode. The processes include forming a mirror protection film on the light emitting epi-layers. The mounting between the reflective and conductive metal substrate on the protection film is though a metal adhesive layer. Afterward, the temporal GaAs substrate is removed. Thereafter, a trench is formed to remove a portion of light emitting epi-layers to expose a p-type ohmic contact epi-layer and the first ohmic contact metal electrode of the light emitting epi-layers. Then the second ohmic contact metal electrode and a wire bonding layer formation are followed. The LED can enhance capability of the light reflect instead of light absorption.

12 Claims, 6 Drawing Sheets

LIGHT EMITTING DIODE AND METHOD OF MAKING THE SAME

This application is a Division of currently application U.S. Ser. No. 10/436,332, entitled "LIGHT EMITTING DIODE AND METHOD OF MAKING THE SAME" and filed on May 13, 2003 now U.S. Pat. No. 6,838,704.

BACKGROUND OF THE INVENTION

1. Field of the Invention

The present invention relates to a light emitting device, and more particularly to an AlGaInP light emitting diode structure and the making method.

2. Description of the Prior Art

Figure 5:
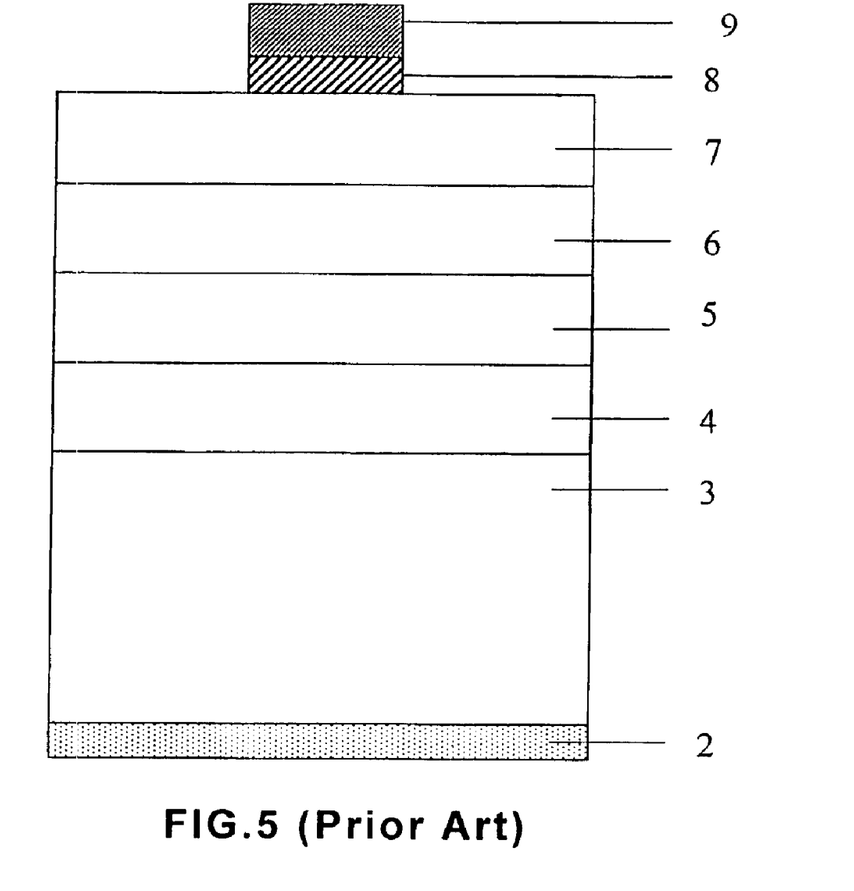
FIG. 5 is a schematic cross-sectional view of the conventional light emitting diode.

The conventional AlGaInP LED has a double heterostructure (DH), as shown in FIG. 5. The LED stacked sequentially, from a bottom thereof, has an n-type ohmic contact electrode 2, a GaAs substrate 3, an n-type $(Al_xGa_{1-x})_{0.5}In_{0.5}P$ lower cladding layer 4 with an Al composition between about 70%–100%, an $(Al_xGa_{1-x})_{0.5}In_{0.5}P$ active layer 5 with an Al composition of 0%–45%, a p-type $(Al_xGa_{1-x})_{0.5}In_{0.5}P$ upper cladding layer 6 with an Al composition 70%–100%, a p-type high energy band gap current spreading layer 7 such as layers of GaP, GaAsP, AlGaAs or GaInP, and a p-type ohmic contact layer 8 as well as a bonding pad 9.

With the composition alternation of the active layer 5, the wavelengths of the light emitted are varied from 650 nm: red to 555 nm: green. A drawback is generally found in the conventional LED, that is: while the light emitted from the active layer 5 towards the substrate 3 will be totally absorbed by GaAs substrate 3. It is because the GaAs substrate has an energy gap smaller than that of the active layer 5. Therefore, the light generated is absorbed resulted in lower light generated efficiency for this kind of conventional AlGaInP LED.

To overcome the substrate 3 light absorption problem, several conventional LED fabrication technologies have been disclosed. However, those conventional technologies still accompany with several disadvantages and limitations. For example, Sugawara et al. disclosed a method published in Appl. Phys. Lett. Vol. 61, 1775–1777 (1992), Sugawara et al. inserted a distributed Bragg reflector (DBR) layer in between GaAs substrate and lower cladding layer so as to reflect those light emitted toward the GaAs substrate. However, the reflectivity of DBR layer is usefully only for those light which almost vertically towards the GaAs substrate. With the decrease of injection angle, the reflectivity is drastically decreased. Consequently, the improvement of external quantum efficiency is limited.

Kish et al. disclosed a wafer-bonded transparent-substrate (TS) $(Al_xGa_{1-x})_{0.5}In_{0.5}P/GaP$ light emitting diode, entitled "Very high efficiency semiconductor wafer-bonded transparent-substrate $(Al_xGa_{1-x})_{0.5}In_{0.5}P/GaP$" on Appl. Phys. Lett. Vol. 64, No. 21, 2839 (1994). The TS AlGaInP LED was fabricated by growing a very thick (about 50 $\mu$m) p-type GaP window layer by hydride vapor phase epitaxy (HVPE) formed on epi-layers light emitting structure. Subsequently, the temporary n-type GaAs substrate is selectively removed using conventional chemical etching techniques. After removing the GaAs substrate, the LED epilayer structure is then bonded to an 8–10 mil thick n-type GaP substrate.

For the light illuminated concerned, the TS AlGaInP LED exhibits a two fold improvement in light output compared to absorbing substrate (AS) AlGaInP LEDs. However, the fabrication process of TS AlGaInP LED is very complicated. Since the bonding process is to make two III–V semiconductor wafers directed bond together by heating and pressing for a period of time. Even worse, a non-ohmic contact interface between them is generally found to have high resistance. To manufacture these TS AlGaInP LEDs in high yield and low cost is difficult as a result.

Another conventional technique was proposed by Horng et al., on Appl. Phys. Lett. Vol. 75, No. 20, 3054 (1999) entitled "AlGaInP light-emitting diodes with mirror substrates fabricated by wafer bonding." Horng et al., reported a mirror-substrate (MS) of AlGaInP/metal/SiO$_2$/Si LED fabricated by wafer-fused technology. In LED, AuBe/Au stack layer function as a bonding layer for silicon substrate and epi-layer LED. However, the intensity of the AlGaInP LED is only about 90 mcd under 20 mA injecting current. The light intensity is at least lower than that of TS AlGaInP LED by 40%. It could not be satisfied.

SUMMARY OF THE INVENTION

The present invention discloses a LED structure which is composed of light emitting epi-layers, a mirror protective layer, a metal adhesive layer, and an electrically & thermally conductive substrate. The result structure provides two electrodes of the LED at the same side and at two different sides for package choice.

The processes include forming a mirror protective layer on light emitting epi-layers and then mounting with an electrically & thermally conductive substrate through a metal adhesive layer. The light emitting epi-layers contains a temporary substrate, an etching stop layer, a lower cladding layer, an active layer, an upper cladding layer, and a p-type ohmic contact epi-layer. A first ohmic contact metal electrode and the mirror protective layer are then formed on p-type ohmic contact epi-layer in order. Afterward, the temporal GaAs substrate and the etching stop layer are then removed. Thereafter, a trench is formed by two steps of etching so as to expose a portion of p-type ohmic contact epi-layer and a portion of the first ohmic contact metal electrode. Then the second ohmic contact metal electrode and a metal bonding layer formation are followed. The LED can enhance capability of the light reflect instead of light absorption.

In the preferred embodiment, the mirror protective layer can be chosen form indium tin oxide (ITO) or other non-conductive but transparent material. The metal adhesive layer can be selected from In, Au, Al, or Ag. The electrically & thermally conductive substrate is selected from the group consisting of gold, aluminum, copper, silicon, gallium phosphorus or silicon carbide and the combination thereof.

Hence, if we desire the electrically & thermally conductive substrate plays as a second electrode and the mirror protective layer is a non-conductive type, at least one connection channel formed in the mirror protective layer to provide the metal adhesive layer injection is demanded.

In the preferred embodiment the metal adhesive layer can be function as a first electrode too since it is a conductive layer.

The benefits of the present invention include:
(1) The result structure provides two electrodes of the LED at the same side and at two different sides for package choice.
(2) The method does not care the surface of the chip whether roughness or smoothness since the metal adhesive layer is a soft material while heating.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A to FIG. 4B illustrate the processes according to the preferred embodiments of the present invention.

DESCRIPTION OF THE PREFERRED EMBODIMENT

The present invention disclosed a new LED structure and the making method. The detailed descriptions accompany with the FIG. 1 to FIG. 4 are as follows.

Figure 1A:
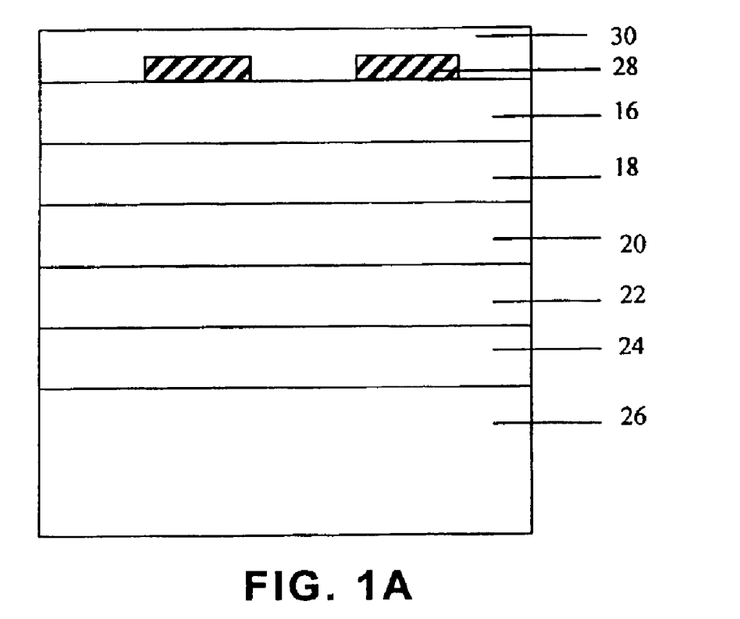
Figure 1B:
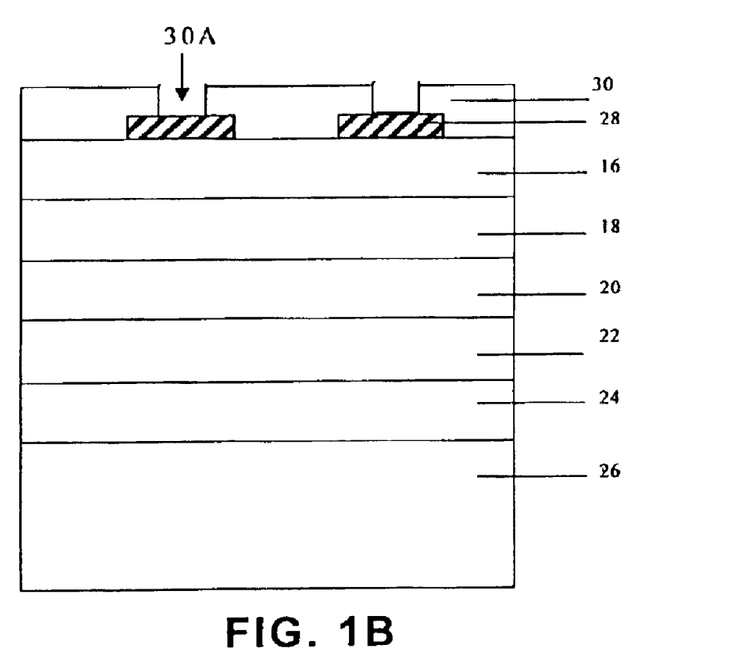

Referring to FIG. 1A and FIG. 1B, the cross-sectional view shows an epi-LED stack structure comprises, from a bottom thereof, an n-type temporary GaAs substrate 26, an etching stop layer 24, a lower cladding layer 22, an active layer 20, an upper cladding layer 18, a p-type ohmic contact epi-layer 16 and a p-type ohmic contact layer 28.

The lower cladding layer 22 is an n-type $(Al_xGa_{1-x})_{0.5}In_{0.5}P$. The active layer 20 is an undoped $(Al_xGa_{1-x})_{0.5}In_{0.5}P$ layer and the upper cladding layer 18 is a p-type $(Al_xGa_{1-x})_{0.5}In_{0.5}P$ layer. After the p-type ohmic contact epi-layer 16 and a p-type ohmic contact layer 28 are formed successively, a mirror protective layer 30 formed thereon is followed. The material of mirror protective layer 30 is selected from the group consisting of indium tin oxide (ITO), indium oxide, tin oxide, zinc oxide, magnesium oxide (MgO), aluminum oxide ($Al_2O_3$), silicon dioxide ($SiO_2$), and silicon nitride (SiNx).

Worthwhile, all of the forgoing materials of mirror protective layer 30 are aninsulator except ITO. Hence, if we desire to use the reflective metal layer that will be described later as the other electrode while the mirror protective layer 30 is an insulation layer, the mirror protective layer 30 has to formed at least one connection channel 30A therein, please see FIG. 1B. The connection channel 30A is to provide a via for metal adhesive layer injection so that the p-type ohmic contact layer 28 and the reflective metal layer can connect electrically.

The p-type ohmic contact epi-layer 16 can be a layer selected from GaP, GaAsP, AlGaAs or GaInP, All of the candidates for serving as the p-type ohmic contact epi-layer 16 require having an energy band gap higher than those of the active layer 18 thereby alleviating the light absorption. Moreover, the p-type ohmic contact epi-layer 16 usually must have high carrier concentrations doped therein so as to form a good ohmic contact.

The $(Al_xGa_{1-x})_{0.5}In_{0.5}P$ active layer 20 is with Al composition of about x=0 to 0.45. The Al dosage in the upper cladding layer 16 and lower cladding layer 22 is of about x=0.5 to 1.0. For situation of without Al containing, the wavelength of the light emitted from $Ga_{0.5}In_{0.5}P$ LED is about 635 nm, which is in a range of red visible light.

As is known by skilled in the art, the ratio of forgoing compound is, for example of the preferred embodiment only, not intended to limit the claim scope. The invention can also be applied to any ratio of the composition. Furthermore, the structure of active layer 20 can be a single hetero-structure (SH), a double hetero-structure (DH), or multiple quantum wells (MQW). Herein an example of DH includes an n-type lower cladding layer 22 of $(Al_xGa_{1-x})_{0.5}In_{0.5}P$, an active layer 20 of $(Al_xGa_{1-x})_{0.5}In_{0.5}P$, and a p-type upper cladding layer 18 of $(Al_xGa_{1-x})_{0.5}In_{0.5}P$. Preferably, the thickness of the three layers are 0.5~3.0 µm, 0.5~2.0 µm, and 0.5~3.0 µm, respectively.

The preferred material of the etching stop layer 24 according to the present invention can be any III-V compound semiconductor material if it can match with that of the GaAs substrate 26 so as to reduce the dislocation density. Another constraint condition for material to be as a candidate of the etching stop layer 24 is the etching selectively thereof. The etching stop layer 24 should be with a lower etching rate than the GaAs substrate 26.

The lower cladding layer 22 can also be served as the etching stop layer 24 according to the embodiment of the present invention since it has a high selectivity to GaAs substrate 26, and thus if the thickness of the lower cladding layer 22 is thick enough, the etch stop layer 24 becomes optional.

Figure 2:
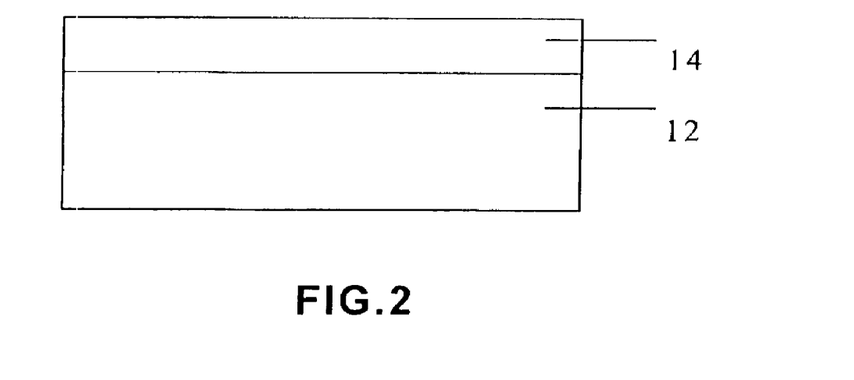

Subsequently, a substrate structure as shown in FIG. 2 is prepared. The structure comprises a metal adhesive layer 14, and a highly electrically & thermally conductive substrate 10. For example, the material of metal adhesive layer 14 can be selected from indium (In), gold (Au), aluminum (Al) and silver (Ag). The electrically & thermally conductive substrate 10 can be chosen from silicon (Si), silicon carbide (SiC), GaP or Au, Al, or Cu.

Thereafter, put the light emitting chip formed with p-type ohmic contact layer 28 and mirror protective layer 30 thereon together with the electrically & thermally conductive substrate 10 by means of the metal adhesive layer 14. The bonding process is implemented at a temperature between about 200° C. to 600° C. associateed with appropriate pressure for a while.

After bonding, the opaque n-type GaAs substrate 26 is then removed and stopped at the etching stop layer 24 by an etchant mixture, for example, $5H_3PO_4:3H_2O_2:3H_2O$ or $1NH_4OH:35H_2O_2$. If the material of the etching stop layer 24 is chosen from InGaP or AlGaAs, the layer 24 is preferably to be removed completely since those materials can still absorb the light generated from the active layer 20.

Figure 3A:
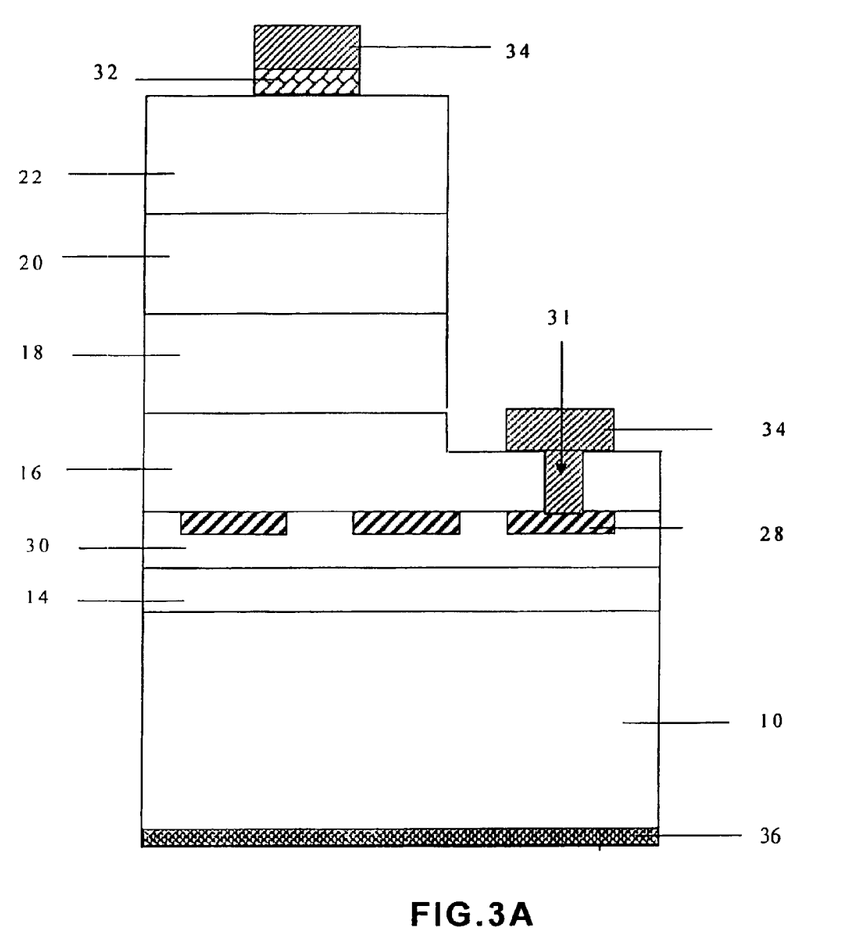
Figure 3B:
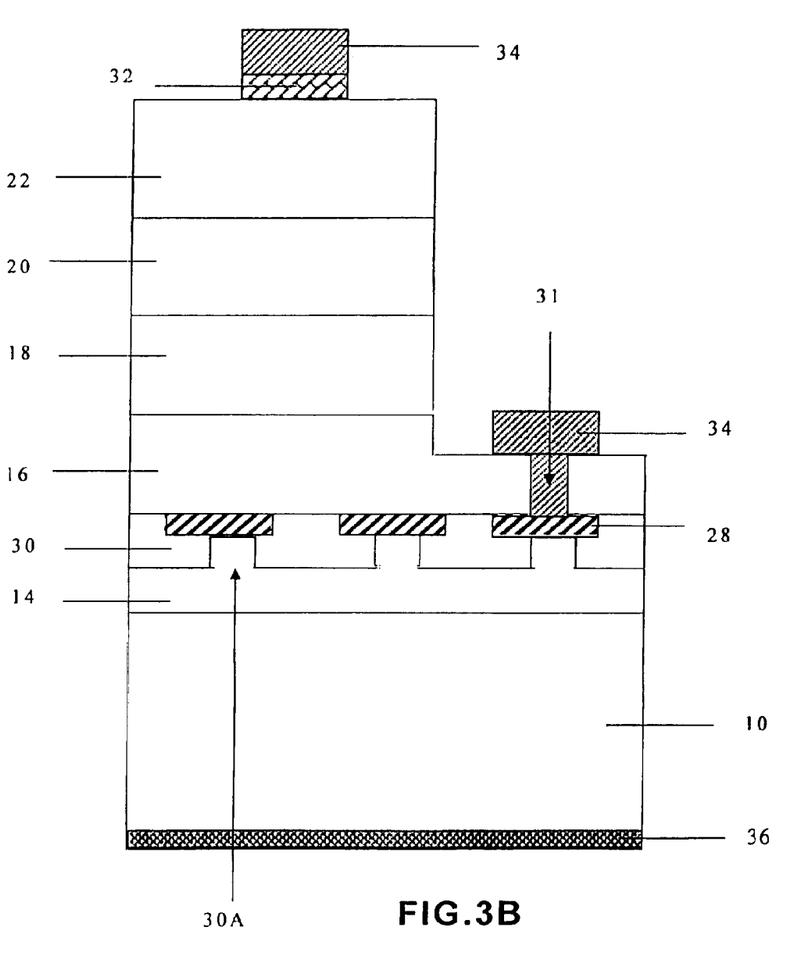

For connecting p-type ohmic contact layer 28, two etching steps are successively carried out. Referring to FIGS. 3A and 3B, the first step is to form a trench. The layers including the n-type lower cladding layer 22, the active layer 20, the p-type upper cladding layer 18, and the p-type ohmic contact epi-layer 16 are etched sequentially through a first lithography and an etching step. The etch step is processed until the p-type ohmic contact metal electrode 30 is exposed. The trench is about 3–6 mil in width. Afterward, a second etching step is done to form connection channel 31 by lithography and an etching step to eachthe p-type ohmic contact epi-layer 16 until a portion of the p-type ohmic contact layer 28 is exposed. The connection channel 31 is about 1 to 3 mil in width.

Thereafter, a photoresist pattern (not shown) is coated on all areas. The photoresist pattern having an opening exposed a portion of n-type lower cladding layer 22 to define n-type ohmic contact electrode 32. An ohmic contact metal layer 32 is then deposited on all areas including the portion on the n-type lower cladding layer 22 and on the photoresist pattern. Afterward, a liftoff process is performed to remove the metal layer on the photoresist pattern. And then stripping away the photoresist pattern is done.

Subsequently, similar to the process of forming n-type ohmic contact electrode 32, a photoresist layer (not shown) is coated on all areas to define two metal bonding electrodes 34 which include openings for the n-type ohmic contact electrode 32 and for the connection channel 31. To make bonding a metal wire easily, and bare the connection channel 31 completely, the size of the opening on the p-type ohmic contact epi-layer 16 is slightly larger than that of the connection channel 31. Thereafter, a wire bonding layer 34 such as a Al layer, or Au layer, is formed on the photoresist layer and filled in openings. The wire bonding layer on the photoresist layer and itself are sequentially removed, the result is shown in FIG. 3A and FIG. 3B.

Worth to note, apart from forgoing two metal bonding electrodes 34 at the same side with respect to the electrically & thermally conductive substrate 10, there is still one another choice: that is two bonding electrodes at different sides by using the electrically & thermally conductive substrate 10 as an electrode if the material of substrate 10 is selected from Au, Al, and Cu. Still if the substrate 10 is selected from SiC, GaP, and Si, one low resistance ohmic contact metal layer 36 formed thereon is needed. FIG. 3A is for the mirror protective layer 30 of electrically conductive type. FIG. 3B is for the mirror protective layer 30 of non-electrically conductive type.

Figure 4A:
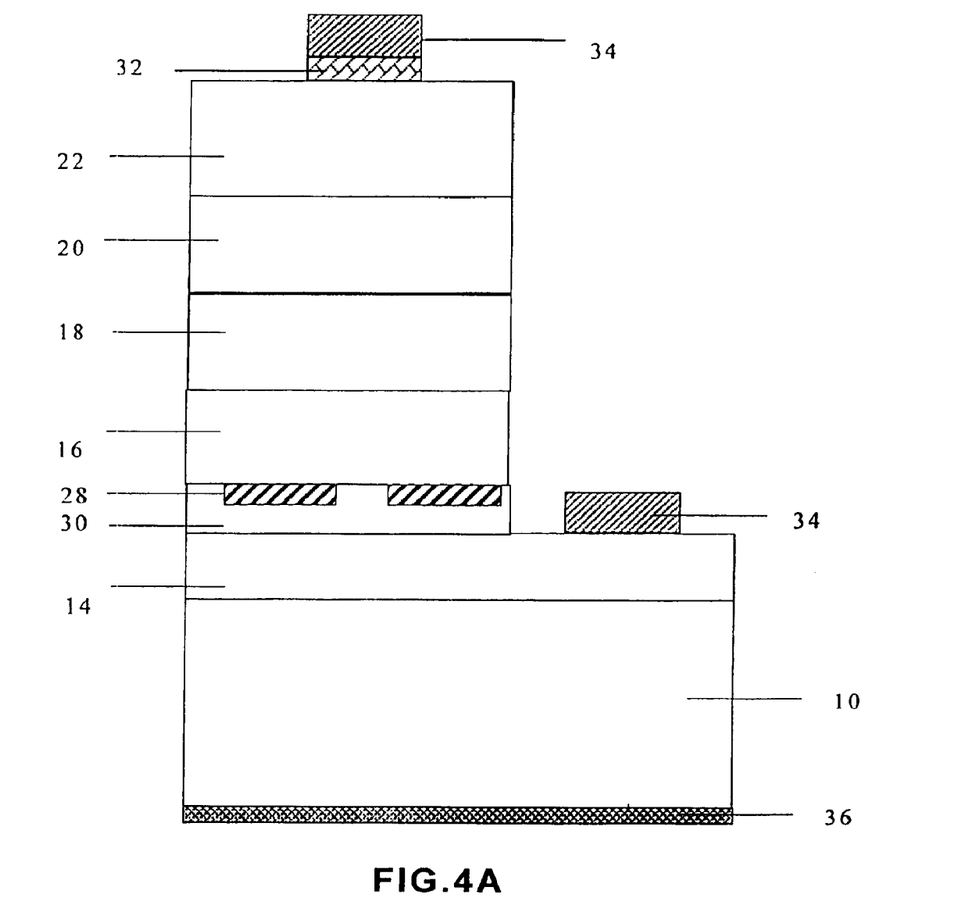
Figure 4B:
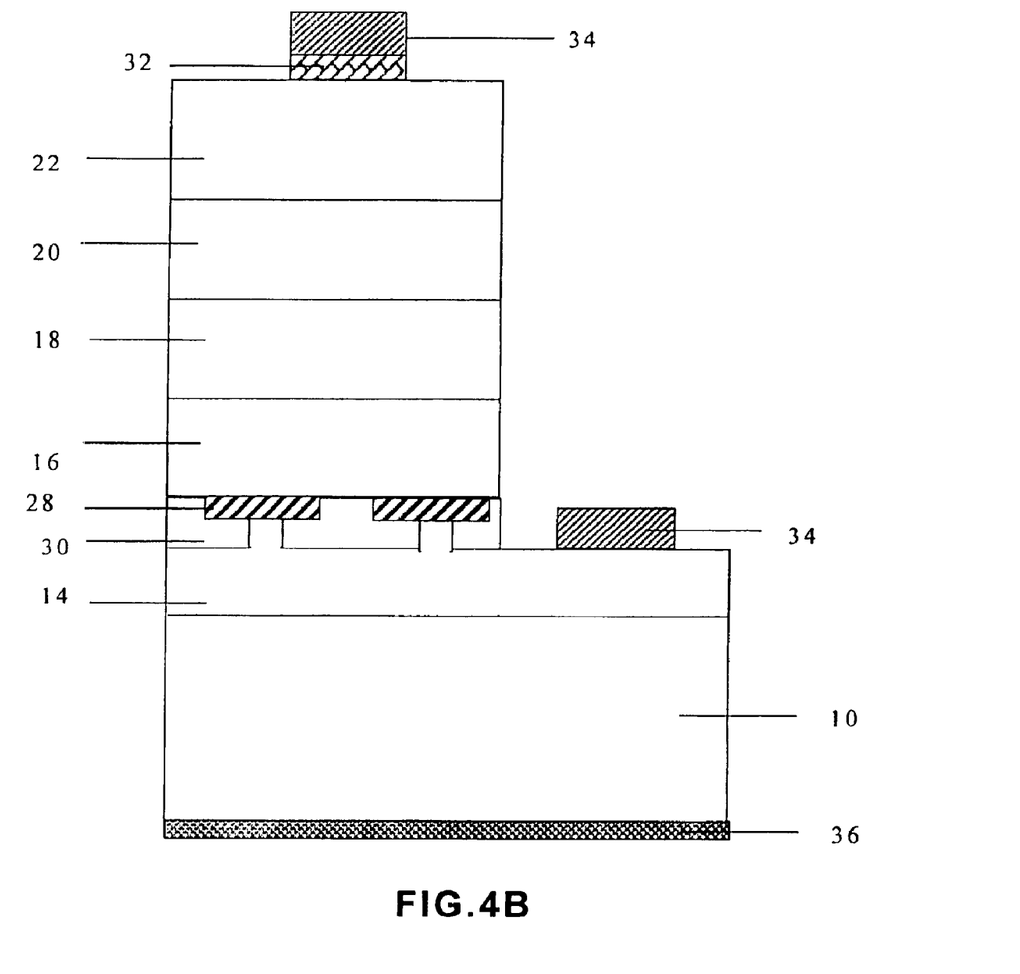

Aforementioned LED structure includes the electrically & thermally conductive substrate 10 adhered to the LED chip having a mirror protective layer 30 by a metal adhesive layer 14 according to the first embodiment of the present invention. The metal adhesive layer 14 can be played as an electrode to connect the p-type ohmic contact layer 28, thus the first embodiment can be modified as follows: please refer to FIG. 4A, the first etching step is processed until to the metal adhesive layer 14, is exposed. Then the steps of forming metal bonding electrode 34 and the low resistance of ohmic contact metal layer 36 are as depicted in the first preferred embodiment. The results are shown in FIG. 4A for electrically conductive type mirror protective layer and FIG. 4B for electrically non-conductive type mirror protective layer. The package of LED structure can be either two electrodes at different sides or at the same side, wherein the low resistance of ohmic contact metal layer 36 is optional.

Forgoing steps are just for illustrating the exemplary embodiment not intended to limit the claim scopes. It will be appreciated that various changes can be modified therein without departing from the spirit and scope of the invention. For example, forgoing preferred embodiment taking the AlGaInP four components LED as an example is just for illustrating convenience, the present invention can apply to other type of LED such as aluminum gallium arsenic (AlGaAs LED) and other infrared ray LED.

While the preferred embodiment of the invention has been illustrated and described, it will be appreciated that various changes can be made therein without departing from the spirit and scope of the invention.

What is claimed is:

1. A method of forming a light emitting diode, comprising the steps of:
    providing a temporary semiconductor substrate having epi-layers thereon sequentially formed on a temporary substrate thereof with an n-type etch stop layer, a lower cladding layer, an active epi-layer, an upper cladding layer, and an ohmic contact epi-layer;
    forming a first ohmic contact metal electrode on said ohmic contact epi-layer;
    forming a mirror protective layer on said ohmic contact epi-layer and said first ohmic contact metal electrode;
    providing an electrically & thermally conductive substrate;
    bonding said electrically & thermally conductive substrate with said mirror protective layer by a metal adhesive layer in between;
    removing said temporary substrate and said n-type etch stop layer,
    etching sequentially from said lower cladding layer of foregoing resulted structure to expose a portion of ohmic contact epi-layer by a lithographic step and an etching step;
    forming a connection channel to expose a portion of said first ohmic contact metal electrode by etching said ohmic contact epi-layer through a lithographic step and an etching step;
    forming a second ohmic contact metal electrode on said lower cladding layer; and
    forming a bonding metal layer on said second ohmic contact metal electrode and on said ohmic contact epi layer and refilling said connection channel.

2. The method according to claim 1 wherein said mirror protective layer is selected from indium tin oxide (ITO) or one of non-electrically conductive type material of indium oxide, zinc oxide, magnesium oxide, aluminum oxide or silicon dioxide, or silicon nitride.

3. The method according to claim 2 while said mirror protective layer is selected from one of said non-electrically conductive type material and further comprises at least one connection channel provided for said metal adhesive layer to inject and hence connect said first ohmic contact metal electrode.

4. The method according to claim said 1 wherein said electrically and thermally conductive substrate is selected from the group consisting of gold, aluminum, copper, silicon, gallium phosphorus or silicon carbide and the combination thereof.

5. The method according to claim 1 and further comprising forming a low resistance ohmic contact layer on one of said electrically and thermally conductive substrate, which is selected from silicon, gallium phosphorus or silicon carbide.

6. The method of according to claim 1 wherein said step of bonding is done at a temperature of about 200–600° C. under pressure.

7. A method of forming a light emitting diode, comprising the steps of:
    providing a temporary semiconductor substrate having epi-layers thereon sequentially formed with an n-type etch stop layer, a lower cladding layer, an active epi-layer, an upper cladding layer, and an ohmic contact epi-layer;
    forming a first ohmic contact metal electrode on said ohmic contact epi-layer;
    forming a mirror protective layer on said ohmic contact epi-layer and said first ohmic contact metal electrode;
    providing an electrically & thermally conductive substrate;
    bonding said electrically & thermally conductive substrate with said mirror protective layer by a metal adhesive layer in between;
    removing said temporary substrate and said n-type etch stop layer
    etching sequentially from said lower cladding layer of foregoing resulted structure to expose a portion of said metal adhesive layer by a lithographic step and an etching step;
    forming a second ohmic contact metal electrode on said lower cladding layer and forming a bonding metal layer on said second ohmic contact metal electrode and on said metal adhesive layer.

8. The method according to claim 7 wherein said mirror protective layer is selected from indium tin oxide (ITO) or one of non-electrically conductive type material of indium oxide, tin oxide, zinc oxide, magnesium oxide, aluminum oxide and silicon dioxide, or silicon nitride.

9. The method according to claim 8 while said mirror protective layer is selected from one of said non-electrically conductive type material and further comprises at least one connection channel provided for said metal adhesive layer to inject and hence connect said first ohmic contact metal electrode.

10. The method according to claim 7 wherein said electrically and thermally conductive substrate is selected from the group consisting of gold, aluminum, copper, silicon, gallium phosphorus or silicon carbide and the combination thereof.

11. The method according to claim 7 and further comprising forming a low resistance ohmic contact layer on one of said electrically and thermally conductive substrate, which is selected from silicon, gallium phosphorus or silicon carbide.

12. The method according to claim 7 wherein said step of bonding is done at a temperature of about 200–600° C. under pressure.

* * * * *